US006759869B1

(12) United States Patent
Young et al.

(10) Patent No.: US 6,759,869 B1
(45) Date of Patent: Jul. 6, 2004

(54) LARGE CROSSBAR SWITCH IMPLEMENTED IN FPGA

(75) Inventors: Steven P. Young, Boulder, CO (US); Peter H. Alfke, Los Altos Hills, CA (US); Trevor J. Bauer, Boulder, CO (US); Colm P. Fewer, Kimmage (IE)

(73) Assignee: Xilinx, Inc., San Jose, CA (US)

( * ) Notice: Subject to any disclaimer, the term of this patent is extended or adjusted under 35 U.S.C. 154(b) by 59 days.

(21) Appl. No.: 10/164,508

(22) Filed: Jun. 5, 2002

(51) Int. Cl.[7] .............................................. H03K 19/177
(52) U.S. Cl. ............................. 326/41; 326/38; 326/47
(58) Field of Search ............................... 326/37–39, 41

(56) References Cited

U.S. PATENT DOCUMENTS

| | | | |
|---|---|---|---|
| 5,705,938 A | | 1/1998 | Kean |
| 6,034,541 A | * | 3/2000 | Kopec, Jr. et al. ............ 326/39 |
| 6,172,520 B1 | | 1/2001 | Lawman et al. |
| 6,288,568 B1 | | 9/2001 | Bauer et al. |
| 6,339,341 B1 | * | 1/2002 | Fujii et al. ..................... 326/38 |

* cited by examiner

*Primary Examiner*—Anh Q. Tran
(74) *Attorney, Agent, or Firm*—Edel M. Young; W. Eric Webostad; Justin Liu (57) ABSTRACT

A method for using an FPGA to implement a crossbar switch is described. Rather than using signals routed through the general FPGA routing resources to control connectivity of the crossbar switch, the input signals only carry crossbar switch data, and the connectivity is controlled by FPGA configuration data. The crossbar switch is implemented in two parts: a template of basic and constant routing to carry input signals through the switch array in one dimension and output signals from the array in another dimension, and a connectivity part controlled by a connectivity table or algorithm to generate partial reconfiguration bitstreams that determine which of the input signals is to be connected to which of the output signals.

24 Claims, 11 Drawing Sheets

LARGE CROSSBAR SWITCH IMPLEMENTED IN FPGA

FIELD OF THE INVENTION

The present invention relates to uses made of field programmable gate arrays (FPGAs), in particular to use of an FPGA to route information from selected input points to selected output points.

BACKGROUND

FPGAs are frequently used for telecommunication. An essential aspect of telecommunication is the ability to route information from any source to any desired destination. A crossbar switch accomplishes this purpose.

Figure 1:
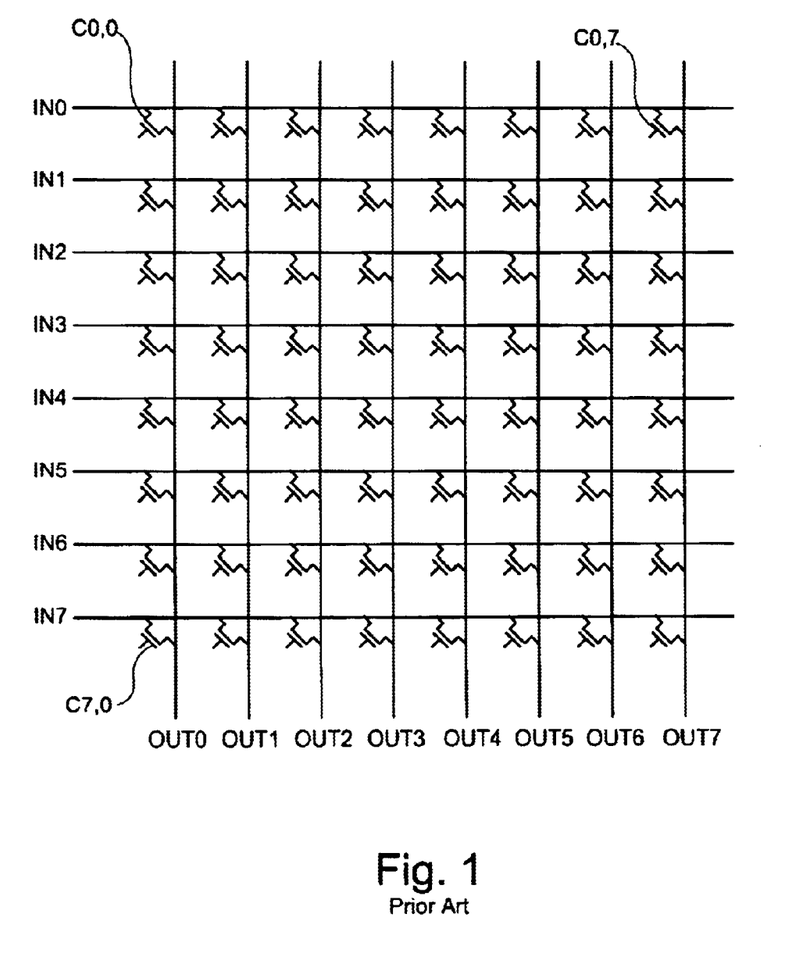
FIG. 1 shows a prior art crossbar switch representation.

FIG. 1 shows a simple crossbar switch. Eight input lines IN0 through IN7 carry input signals and eight output lines OUT0 through OUT7 provide output signals. An array of connectors can be selectively turned on to provide any of the input signals as an output signal. For example, turning on connector C0,0 connects input line IN0 to output line OUT0. Turning on connector C0,7 connects input line IN0 to output line OUT7. It is important that an output line not be driven by more than one input signal so that no contention occurs, and for this reason, crossbar switches are often implemented as multiplexers.

Figure 2:
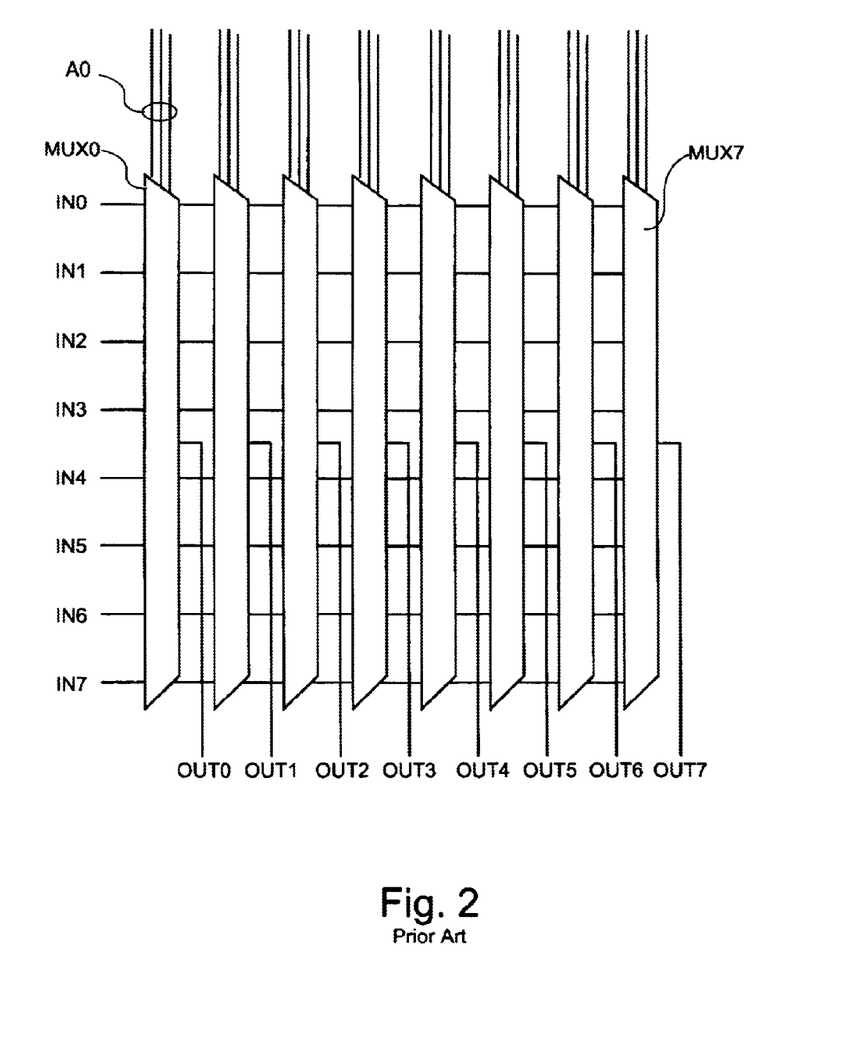
FIG. 2 shows a prior art multiplexer implementation of the crossbar switch of FIG. 1.

FIG. 2 shows a multiplexer implementation of the crossbar switch of FIG. 1, in which multiplexer control signals select one and only one of the input signals to provide as an output signal. For example, multiplexer control signals A0 select which of the eight input signals IN0 through IN7 will be provided as output signal OUT0.

As the number of input and output signals increases, the size of the crossbar switch becomes larger in proportion to the product of the number of input and output signals. For example, an array accommodating 1000 input signals and 1000 output signals would require a million connectors. If implemented with multiplexers, the crossbar switch would require 1000 multiplexers, each with 1000 input signals. U.S. Pat. No. 6,288,568 to Bauer and Young entitled "FPGA Architecture With Deep Look-Up Table RAMs" describes an FPGA architecture having lookup tables that can generate a function of eight input signals.

Figure 3:
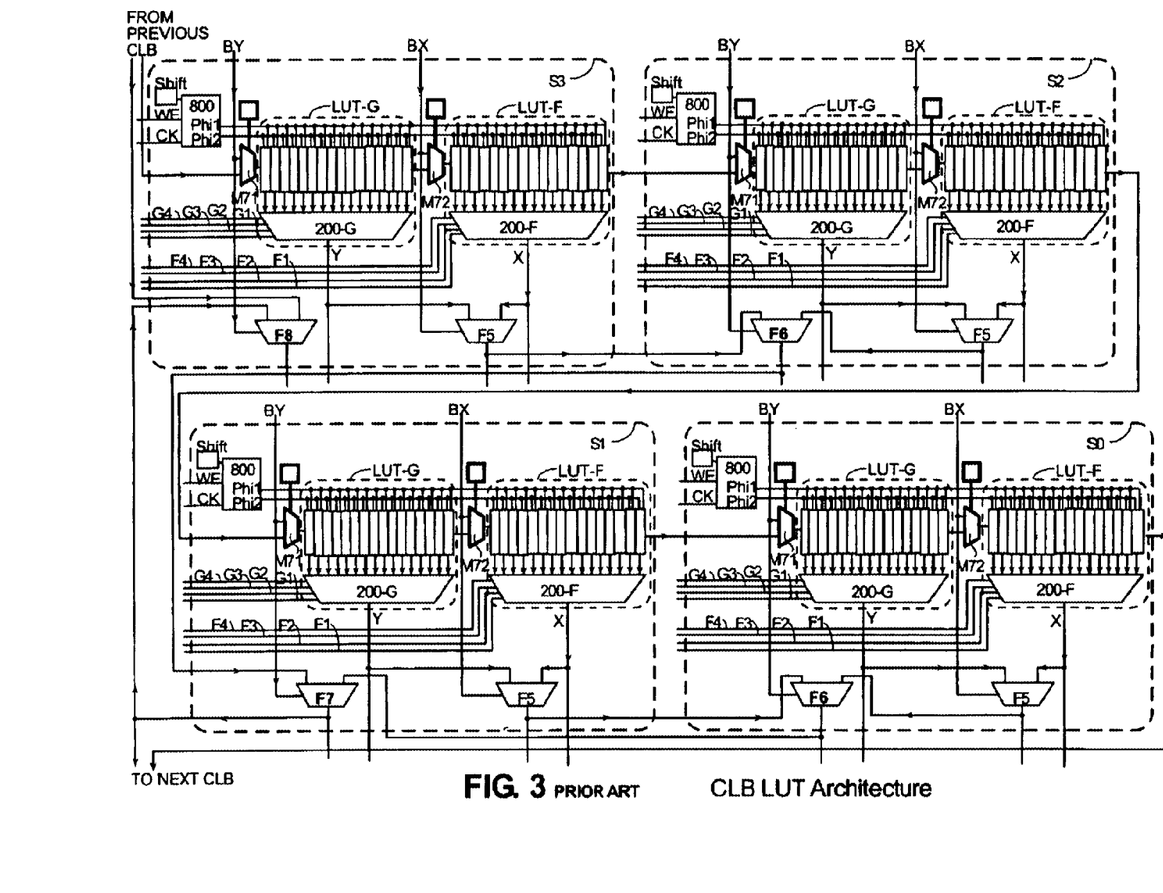
FIG. 3 shows a prior art FPGA architecture that can be used to implement a crossbar switch.

FIG. 3 is a copy of FIG. 20 of the Bauer and Young patent and represents one configurable logic block (CLB) of to an FPGA. One possible function that can be generated by this flexible structure is a multiplexer. In FIG. 3, the lookup tables are 4-input lookup tables (LUTs), and thus each LUT can implement a 2-input multiplexer. The inputs applied on three of the lines F1, F2, F3, and F4 or G1, G2, G3, and G4 to each 4-input LUT are two multiplexer data inputs and one multiplexer control input. Eight lookup tables are present in the CLB of FIG. 3, each labeled LUT-F or LUT-G.

To form a conventional crossbar switch, the LUTs are each configured to implement a 2-input multiplexer with these three inputs. Sixteen data signals can be applied to these eight LUTs, two to each LUT. The lowest order multiplexer control bit C0 is applied to all eight LUTs and serves as the control bit for each of the eight 2:1 multiplexers. The next lowest order control bit C1 is applied to each of four multiplexers labeled F5, which receive outputs from pairs of the LUTs. Thus the outputs of the F5 multiplexers are 4:1 multiplexer outputs. Pairs of the F5 multiplexers feed F6 multiplexers as controlled by control bit C2, and pairs of the F6 multiplexers feed the F7 multiplexer as controlled by control bit C3. The F7 multiplexer thus provides the output of a 16:1 multiplexer. Another structure the same as FIG. 3 but receiving 16 different input signals receives the same control signals C0 through C3. The F8 multiplexer receives input signals from two F7 multiplexers and is controlled by a still higher order control bit C4 to produce a 32:1 multiplexer output signal. Thus an adjacent pair of CLBs can implement a 32:1 multiplexer.

Of course, providing these data and control signals requires routing through the FPGA. This routing has not been shown because it is easy to understand that the necessary route for each signal is formed by programmably connecting together the interconnect lines to get the data and control input signals from their origins and to get the output signals to their destinations.

Still wider multiplexer functions are formed by using another level of hierarchy. For example, a 1024:1 multiplexer can be formed in a very large FPGA by configuring 32 additional pairs of CLBs to each implement a 32:1 multiplexer, then finally forming a higher level structure, also from two CLBs, in which the input signals are the F8 output signals from the 32 pairs of CLBs. Thus the output of this final structure is the output of a 1024:1 multiplexer, and has consumed 64+2 CLBs or 66 CLBs. A square crossbar switch (1024 inputs and 1024 outputs) would require 1024 of these structures or a total of 67,584 CLBs.

One of the largest FPGA available from Xilinx Inc. today has on the order of 8,000 CLBs, so such a switch can not be implemented this way in such an FPGA but would require about 9 FPGAs.

It would be desirable to implement a large crossbar switch in an FPGA in a manner that is denser than this prior art implementation, preferably one that will fit into a single FPGA.

SUMMARY OF THE INVENTION

According to the invention, a switch such as a crossbar switch is implemented in an FPGA by using the FPGA's configuration memory cells to control multiplexers that perform the routing of signals through the switch. Thus, the multiplexer control is established during configuration or reconfiguration of the FPGA and the multiplexer input data passes through the configuration multiplexers. This contrasts with the above described prior art implementation babe both the multiplexer input signals and the multiplexer control signals are applied to inputs pins of the FPGA after it has been configured. In one embodiment, the invention is implemented in an FPGA in which each CLB of the FPGA has several LUTs, for example eight 4-input LUTs, and an input multiplexer (IMUX) routes signals to each LUT. The IMUX receives control signals from the configuration memory cells. Rather than changing the switch configuration by changing control input signals, the switch configuration is changed by reconfiguring one or several IMUXs of the FPGA.

As an optional feature of the invention, an input signal applied to a single pin is deserialized and applied to several different internal input lines. In one embodiment, each input signal on one input pin is applied to four different input lines. Likewise, four output signals are serialized and placed onto a single output pin. For an FPGA with a given number of pins, this increases the amount of logic the FPGA can process. An FPGA having on the order of 250 input pins and 250 output pins (or 500 I/O pins) can implement a 1000× 1000 crossbar switch by making use of a 4:1 serializer/deserializer (SERDES) feature. If each input and output signal is applied to two pins as a low voltage differential signal (LVDS), and a 4:1 SERDES is used, 1000 physical pins are required for a 1000×1000 crossbar switch.

Of course, consideration must be made for how the user changes or partly changes the configuration in order to reconfigure the IMUXs. Changing control signals in the IMUX is slower than simply applying a new multiplexer control signal to a LUT, as described above for a prior art crossbar switch implementation. However, in some applications this is acceptable because data needs to flow at high speed, but its destination changes only occasionally. Some FPGAs are reconfigured by shifting data into a configuration frame register in the FPGA and loading the frame register data into the designated frame. It may be necessary to load a full frame of data during a partial reconfiguration. In Virtex-II FPGAs available from Xilinx, Inc., this is true. An IMUX can be reconfigured by loading four frames of data. Typically, the user will want to disconnect one input terminal from an output terminal and connect another input terminal to the output terminal. This operation requires loading no more than six frames of configuration data and takes about 140 microseconds. This reconfiguration rate is fast enough for some communications applications. Importantly, the connectivity of the crossbar switch can be changed with a small amount of reconfiguration.

A benefit of the invention is that it is an order of magnitude more dense than the prior art method. For example, in a Virtex-II FPGA, a single CLB can implement eight 144:1 multiplexers, one in each LUT and associated IMUX. Making use of all these inputs may be impractical due to limitations in routing available in the Virtex-II FPGA. In one embodiment, eight 33:1 multiplexers are implemented in one CLB. That compares to the prior art method in which two CLBs can implement one 32:1 multiplexer. This is more than a 16:1 improvement in density. Of course other embodiments will differ in the details of the FPGA architecture, and thus in the relative improvement.

In communications use, FPGAS implementing crossbar switches are reconfigured to change which input is connected to which output, but most of the configuration is retained. In one embodiment, to change the connectivity, the lookup tables and routing are not reconfigured, and only the IMUXs are reconfigured. A table of configuration values may be stored in a computer that configures the FPGA, one set of bits to be turned on for each input-to-output connection, and used to set up the configuration bitstream for a partial reconfiguration due to changing connectivity of the crossbar switch. An algorithm for generating the bits may also be used. By taking advantage of the regularity and the fact that the CLBs are identical, the algorithm would simply generate bitstream instructions based on the desired location with a CLB.

In yet another optional feature of the invention, a pipelining structure can be included in the FPGA such that input signals routed on long horizontal or vertical paths are captured and retransmitted periodically. If it is necessary that all signal paths experience the same latency, shift registers can be implemented to delay signals on fast paths so that all signal paths experience the same latency.

It is typically desired to implement a crossbar switch as a static structure, but to change the connectivity every time there is a change in the use of the switch. It is desirable to make a change in connectivity without disruption of any other connections that the switch is currently providing. A Virtex-II FPGA can be partially reconfigured by changing a few frames of configuration data. Ongoing communication can continue on all paths except the ones being reconfigured. Those IMUXs that stay the same in the reconfigured column are unaffected and can continue to pass data.

DETAILED DESCRIPTION

Figure 4:
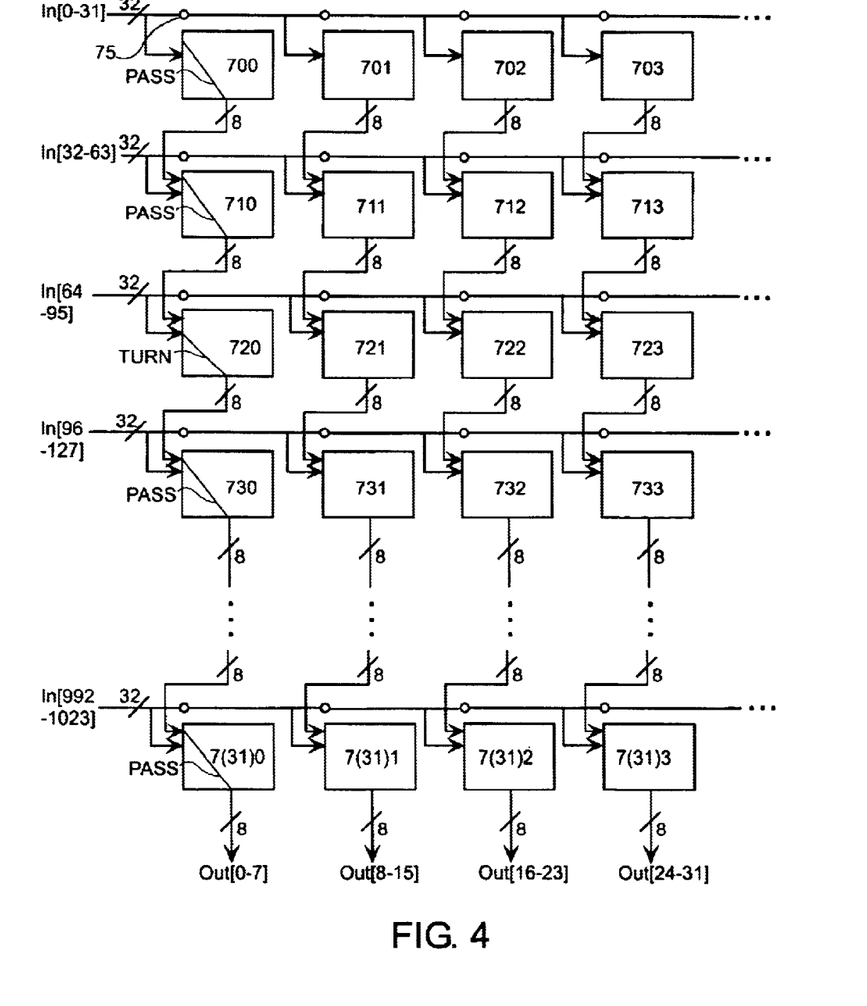
FIG. 4 shows an embodiment of the invention in which selected signals from the left are routed to output terminals at the bottom to implement a crossbar switch.

FIG. 4 shows one embodiment of the crossbar switch of the present invention. Input lines In0 through In1023 come from the left and are connectable through CLBs 700 through 7(31)3 and more not shown to output lines Out0 through Out31 and more not shown. In FIG. 4, horizontal interconnect lines in the FPGA are connected by programmable interconnection points (PIPs) such as PIP 75 (represented here by small circles) to form long horizontal routing lines. Each CLB receives signals on 32 input lines from the left and provides signals on 8 output lines extending downward. For example, CLBs 710, 711, 712, and 713 (and more not shown) receive input signals on lines In32 through In63. These four CLBs also receive input signals from CLBs 700, 701, 702, and 703, respectively. Thus, in FIG. 4, each CLB receives 40 input signals, 32 from the left, and 8 from above. Each CLB provides 8 output signals on lines connected to the CLB below.

Within each CLB, multiplexers are programmed by memory cells to either forward the 8 signals from above to the output terminals extending downward, or to forward selected ones of the 32 input signals from the left to one of the 8 output terminals extending downward. This can be best understood by looking at FIGS. 5, 6, and 7.

Figure 5:
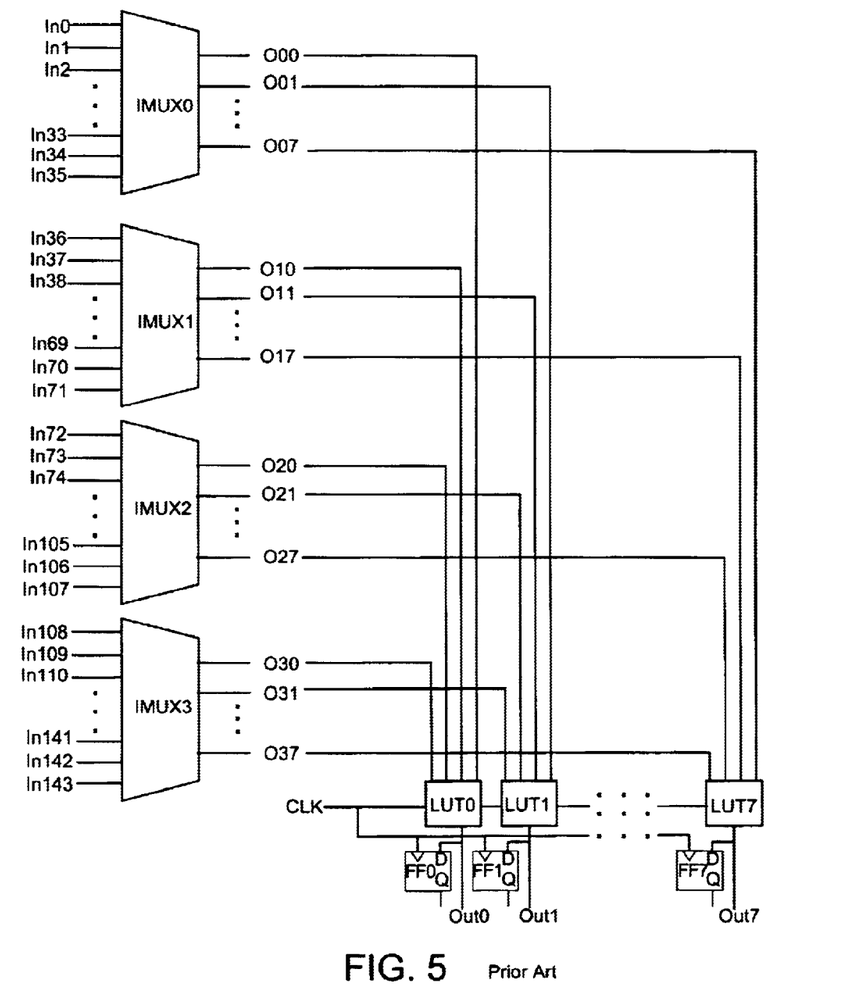
FIG. 5 shows an overview of the structure of an input multiplexer (IMUX) and lookup tables that can be used with the invention.

FIG. 5 shows the structure of an input multiplexer (IMUX) present in each configurable logic block (CLB) of a Virtex-II FPGA available from Xilinx, Inc., in combination with LUTs of the CLB. In a Virtex-II FPGA there are eight lookup tables (LUTs) in each CLB, and the IMUX can route signals to all eight of the LUTs.

The structure of FIG. 5 is preferably programmed to implement 32 rows and eight columns of the switches such as are illustrated in FIG. 1 or implement the eight multiplexers illustrated in FIG. 2. FIG. 5 actually shows 144 signals coming from the left. However, these signals come from many directions on lines of varying lengths, and only the signals shown in FIG. 4 will ever be selected. That means only lines from LUT outputs from above are selected for implementing the vertical paths of FIG. 4, and only the 32 horizontal lines coming from the left in FIG. 4 will be selected. Thus, in FIG. 5, each multiplexer IMUX0 through IMUX3 selects one of about 10 of the 36 input signals shown. Looking at FIG. 5, each LUT LUT0 through LUT7 is programmed to respond to only one of its four input signals, passing that input value to its output terminal. Thus these LUTs do not implement multiplexers but simply pass signals. For example, LUT0 may be programmed to pass signal 000 from multiplexer IMUX0 and to ignore the other three input signals 010, 020, and 030.

In one embodiment, the output signal from each of LUT0 through LUT7 is registered in response to a clock signal CLK, and as is well known, a register provides the D input signal as a Q output signal on the next rising clock edge. Thus, looking back at FIG. 4, an input signal, after turning at a selected CLB, moves down one row for every clock cycle. In another embodiment, useful for smaller arrays, registering is bypassed, and the LUT output signals are simply routed asynchronously to the next row below. In yet another embodiment, registering is used every few rows, for example, every four rows, in which case the signal propagates downward four rows for every clock cycle. Such an embodiment is appropriate for large arrays as long as timing requirements are met no matter where the signal may turn the corner.

Figure 6:
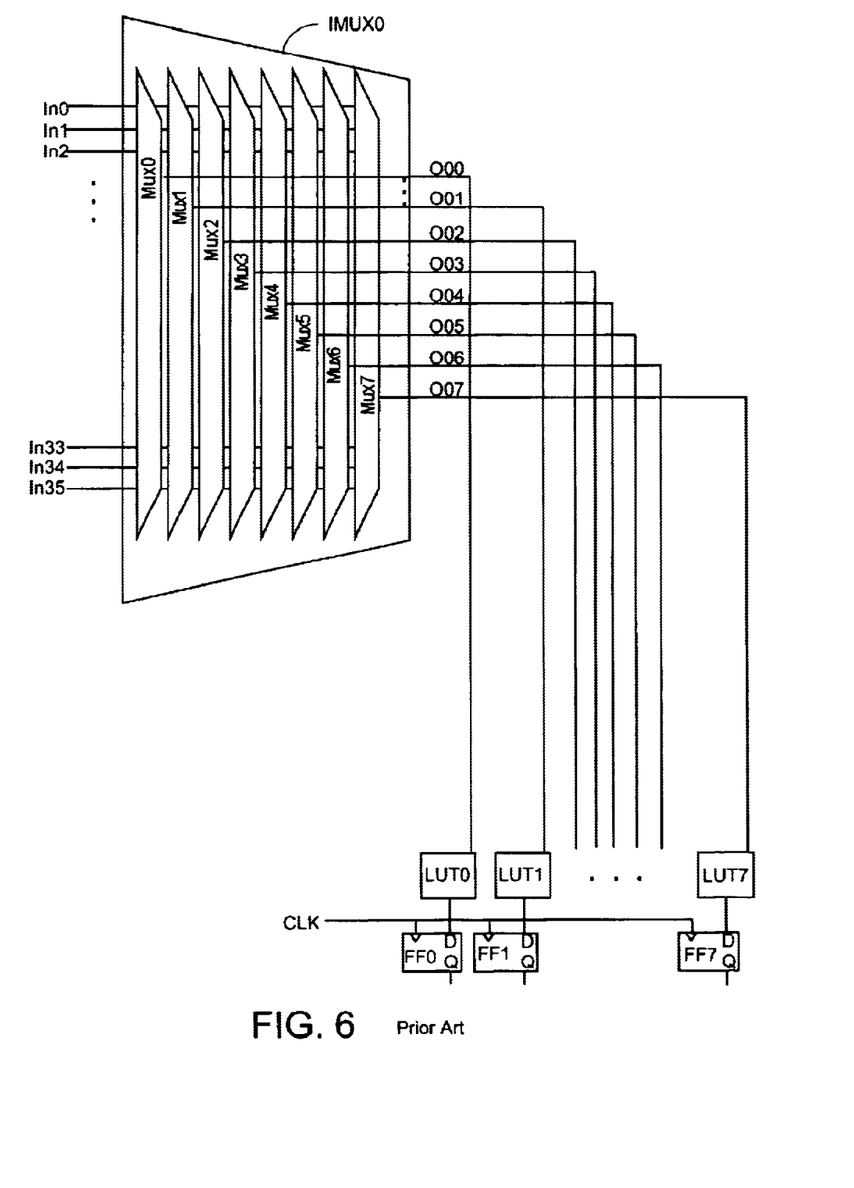
FIG. 6 shows how one multiplexer of FIG. 5 drives the 8 LUTs of FIG. 5.

Looking at FIG. 6, we see that multiplexer IMUX0 is made up of eight multiplexers, Mux0 through Mux7, and that each of these provides a signal to one of the eight LUTs LUT0 through LUT7.

Figure 7:
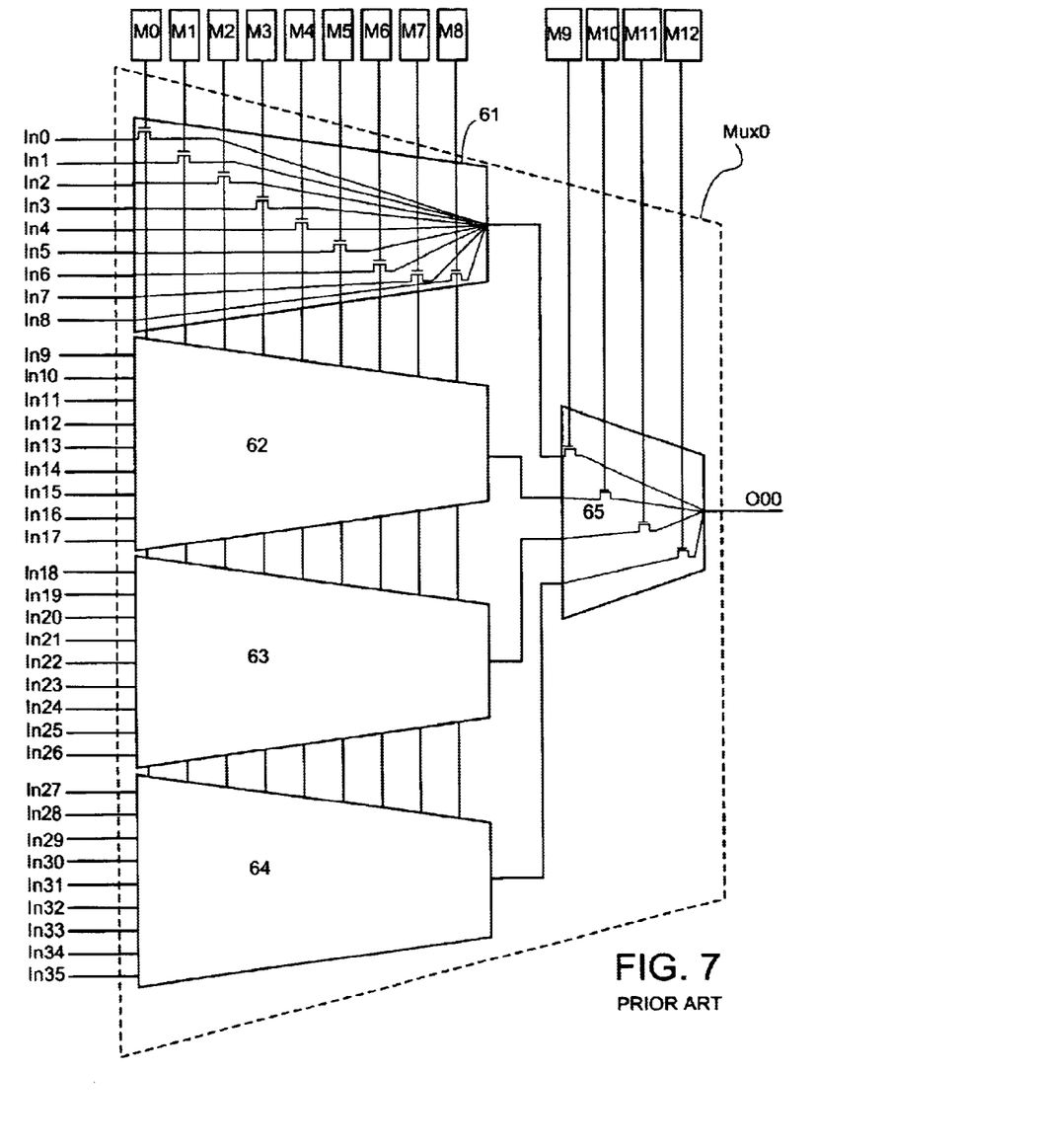
FIG. 7 shows the detail of one of the multiplexers in the IMUX of FIG. 5 and illustrates the memory cells that are changed when changing connectivity of the crossbar switch.

FIG. 7 shows a possible makeup of Mux0 as a two-stage multiplexer, that is, where e two pass transistors connect an electrical path from one of the input terminals In0 through In35 to the output terminal 000, and 13 memory cells M0 through M12 control this selection. Memory cells M0 through M8 control first stage multiplexers 61 through 64 and memory cells M9 through M12 control second stage multiplexer 65. Every multiplexer Mux0 through Mux7 of FIG. 6 will have a similar structure and be controlled by 13 different memory cells. Thus multiplexer IMUX0 of FIG. 6 is controlled by 104 memory cells. Because some of the 36 input signals in FIG. 7 come from directions that will not be used, some of memory cells M0 through M12 in any particular multiplexer MUX0 through MUX7 may never be turned on to implement some embodiments of the present invention. On average, only 10 of the 36 input signals will ever be selected as the output signal. For each multiplexer MUX0 through MUX7, some of the signals will come from horizontal lines and one signal will come from above. For example, if signal In0 comes from above, it will be selected by turning on transistors associated with memory cells M0 and M9. If one of these signals from the left is In9, and it is desired to provide this signal as an output signal, then turning on transistors associated with memory cells M0 and M10 will select input signal In9.

Many multiplexer structures are known and are used in alternative FPGA structures. The invention will work with alternative multiplexer structures as well. An important aspect of the present invention is that the configuration memory cells do the selecting of which external input pin of the FPGA is to be connected to which external output pin of the FPGA. In this case, memory cells M1 through M13 and others controlling other multiplexers of the IMUX of each CLB select which input signal will be provided as an output signal to a LUT.

Preferably the LUT is not reconfigured when the crossbar switch connectivity is changed. This may be accomplished by programming the LUT to implement the AND function of its four input signals, and applying logic 1 values to the input terminals not receiving the crossbar switch output signal. IMUXs can be used to route the logic 1 signals to LUT input terminals not receiving the data signal. Returning to FIG. 5, if the LUTs LUT0 through LUT7 have been configured as AND gates with three inputs as constant logic 1 and the fourth input providing the crossbar switch data signal, then it is necessary to route three logic 1 signals to the three LUT inputs not receiving the data signal. Logic 1 signals can be placed onto unused routing lines within the FPGA and routed to one of the inputs to IMUX0 through IMUX3, and multiplexers MUX0 through MUX7 (FIG. 7) of IMUX0 through IMUX3 (FIG. 5) that are not providing the data signal to LUT0 through LUT7 are programmed to route this logic 1 signal to LUT0 through LUT7.

Alternatively, the LUT may be programmed to simply pass one of its input signals through as the crossbar switch output signal. This will require some reprogramming of the LUT because different ones of the crossbar switch input lines are connected to different IMUX input terminals and are therefore routed to different LUT input terminals. Thus the selected LUT input terminal will change as the connectivity changes. As can be seen by studying FIG. 3, each of LUTs LUT0 through LUT7 includes 16 memory cells to form the LUT, and the four input signals of FIG. 5 are F1 through F4 or G1 through G4 of FIG. 3. Thus 16×8 or 128 memory cells configure LUTs LUT0 through LUT7 of FIG. 5.

Folding to Improve Aspect Ratio

In order to implement a 1024×1024 crossbar switch using the embodiment of FIG. 4, the crossbar switch would have to use 32 rows of CLBs and 128 columns of CLBs. This is not a preferred aspect ratio, because FPGAs are typically almost square. According to another embodiment of the invention, the 128 columns are folded or interleaved to produce a structure 64 CLBs high and 64 CLBs wide.

Figure 8:
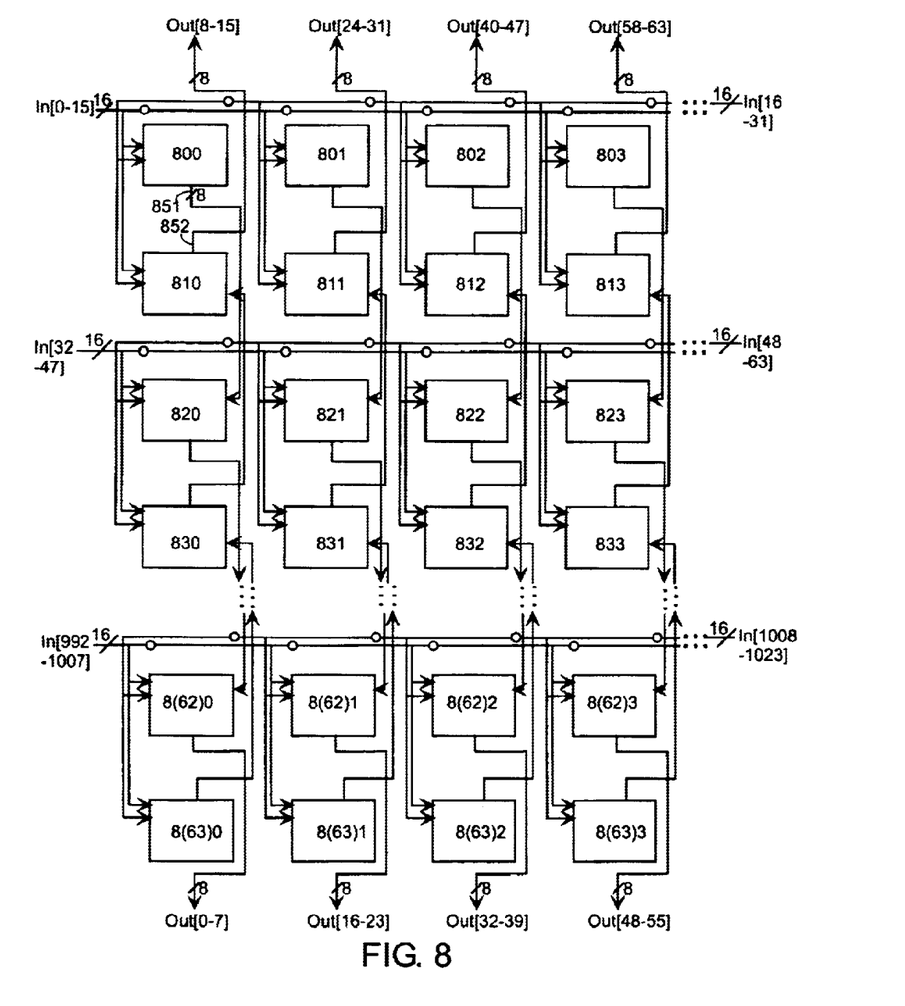
FIG. 8 shows another embodiment of the invention in which selected signals from the left and right are routed to output terminals at the top and bottom, thus improving the aspect ratio and pin-out of the crossbar switch.

FIG. 8 shows an embodiment of the invention that achieves this aspect ratio. The embodiment of FIG. 8 also achieves a better distribution of input signals, receiving input signals from both left and right, and providing output signals at both the top and the bottom. In order to retain the crossbar nature, in which any input pin can be connected to any output pin. identical input data is provided to two vertically adjacent rows of CLBs. But the output signals from the two rows are different.

Thus one row of a pair can be thought of as representing the left half of the structure in FIG. 4 and one row the right half. In FIG. 8, the rows including CLBs 800–803 and 810–813 both receive the first 32 input signals In0 through In31. Input signals In0 through In15 originate at the left, and input signals In16 through In31 originate at the right. Looking just at the left-most column, CLB 800 provides eight output lines 851, which are programmed to connect to double-length lines leading downward to CLB 820. These signals on lines 851 eventually contribute to the output signals at the bottom of the array Out[0–7]. Output lines 852 from CLB 810 are connected to double length lines that lead upward. Since there are no more CLBs above CLB800, lines 852 become output lines from a column including CLBs 810, 830, and others, but not including CLBs 800 and 820. Thus CLB 810 generates output signals Out[8–15] at the top of the array.

Only 16 input signals In[0–15] come from the left. Sixteen more input signals In[16–31] come from the right of the array. All 32 of these signals are provided to all CLBs in the top two rows. Likewise, other pairs of rows receive additional groups of 32 input signals, as shown. Thus FIG. 8 implements a 1024×1024 crossbar switch in a 64×64 array of CLBs.

Figure 9:
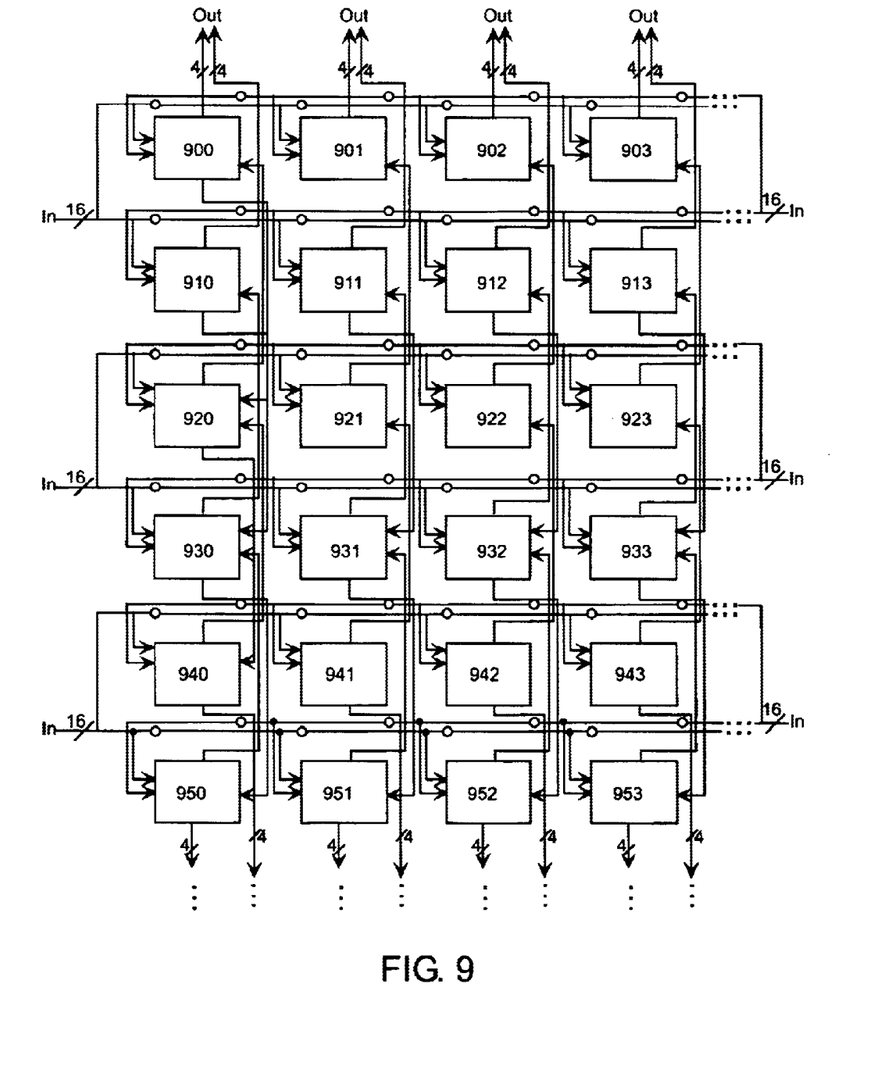
FIG. 9 shows an embodiment similar to FIG. 8, in which the routing of vertical and horizontal signals is more regular.

FIG. 9 shows yet another embodiment in which input signals are routed to the pairs of rows, and the horizontal routing lines are duplicated. This embodiment may be easier to implement for certain FPGAs having routing structures with particular patterns of routing lines, not requiring the use of vertical routing lines two CLBs long to provide the 32 input signals on each row, as was required in FIG. 8. FIG. 9 also differs by being more regular in providing output signals, each CLB providing 4 output signals moving upward and four output signals moving downward. Again the vertically extending output signals are placed onto double-length lines, and bypass the adjacent row of CLBs.

Figure 10:
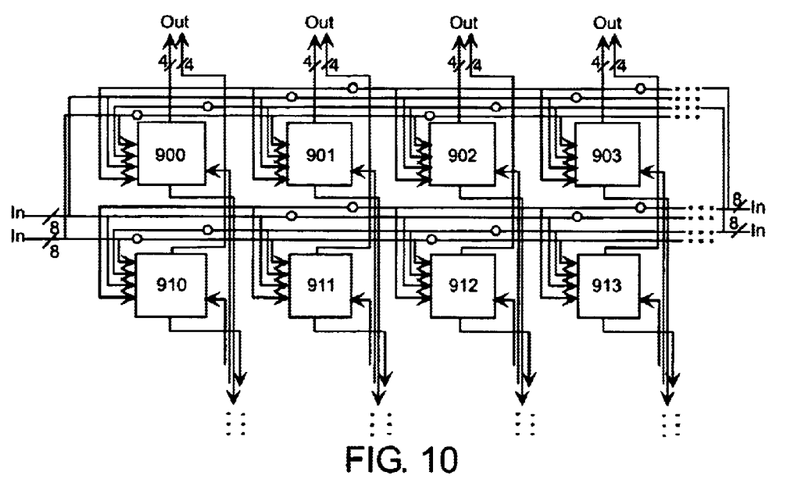
FIG. 10 shows yet another embodiment similar to FIG. 8, but in which double-length lines are used for routing all signals.

FIG. 10 shows yet another embodiment in which double-length horizontal lines are used, thus achieving along horizontal routing path with half the number of connections (transistors) in the connection path as with single-length lines, and therefore higher speed. The structure of FIG. 10 still provides 32 input lines to each CLB, but they come from four sources rather than two.

Double-Length Lines, SERDES

Figure 11:
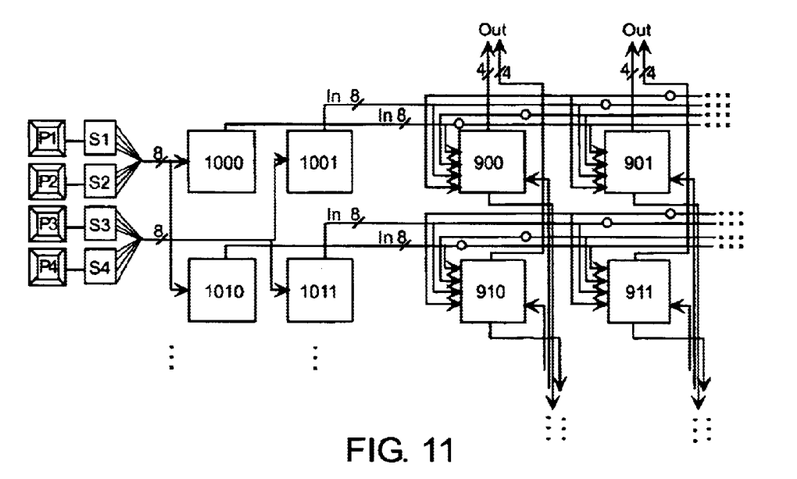
FIG. 11 shows a structure for deriving horizontal double-length line signals from input pins.

FIG. 11 shows a structure for generating the signals that come from pins on the left, and it is assumed that identical structures will be provided on the right. CLBs 1000 and 1001, located in the same row, each apply signals to double-length lines. For the next row in the pair, CLBs 1010 and 1011, also located in one row, each apply signals to double-length lines in their row. The eight signals come from the eight LUTs and flip-flops in the CLBs. In an architecture such as the Virtex-II FPGA discussed above, double-length lines originating in CLB 1000 are different from those originating in CLB 1001, and thus 16 different signals are supplied. The same is true for CLBs 1010 and 1011. The right portion of FIG. 11 includes equivalent structures to that shown at the left portion of FIG. 11.

There are a large number of pins in a large FPGA such as a Virtex-II FPGA device, but even this large number is not sufficient to readily connect input and output signals in a 1024×1024 crossbar switch. To increase access to internal structures, the Virtex-II FPGA includes SERDES circuits in its input/output structure. A SERDES circuit converts a high speed serial signal received on an input pin to several lower speed parallel signals applied to several internal lines in the device. Likewise, for output signals, the SERDES circuit combines four internal output signals into one serialized output signal on one pin. FIG. 11 shows four pins P1 through P4 each supplying one signal to one SERDES circuit IMUX1 through IMUX4. Two of these SERDES circuits supply the eight signals in a bus such as the 8-line buses leading to CLBs 1000 and 1001 of FIG. 11. In yet another embodiment, low voltage differential signaling (LVDS) uses two input pins for each input signal, and the two signals are combined internally to form a single high speed signal, which is then supplied to a SERDES circuit to generate several, for example four, lower speed internal signals.

The reverse occurs for output signals at the top and bottom of the array. The SERDES circuit receives several, for example four, lower speed internal signals, uses a multiplexer to sample the four signals, and generates a higher speed serialized output signal for applying to a pin.

Pipelining

In a large crossbar switch operating at high speed, it may not be possible to move signals across an entire array in a single clock cycle. A pipeline structure allows the signals to be moved reliably by a clock operating at the required bit rate (155 MHz in one embodiment). The signals are captured upon a clock edge in latches or flip-flops and then retransmitted after the clock edge. Thus it will take, several clock cycles for a signal to pass through the array.

Horizontal Pipelining

In one embodiment, input signals routed on horizontal interconnect resources are carried on four serially connected double-length lines, then into CLBs where are applied to flip-flops within CLBs. The flip-flop output signals are applied to further double-length lines, repeating until the signal has made its way across the FPGA.

Figure 12:
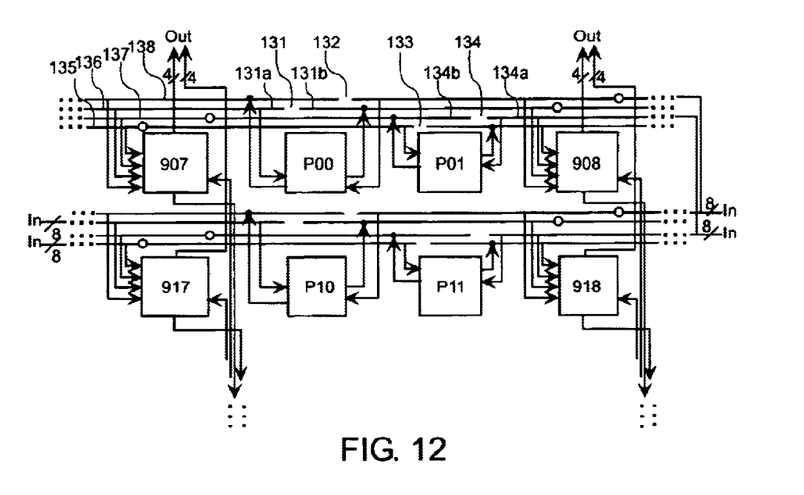
FIG. 12 shows a pipelining structure that may be used with the invention.

FIG. 12 shows two rows in which pipelining structures have been inserted. Instead of being continuously connected, the series connections of horizontal lines are unconnected at locations 131 through 134 in two adjacent columns of CLBs, and equivalent locations in other rows. CLBs P00, P01, P10, and P11 in these two columns are configured to route incoming signals (indicated by arrowheads) to the D inputs of flip-flops within the CLBs and to provide the output signals on the next clock edge. For example, the signal on line 131a coming from the west is applied by CLB P00 to line 131b one clock cycle later. Instead of using only input lines coming from the west, some input signals come from the east, as illustrated in FIG. 12. For example, the signal on line 134a coming from the east is applied by CLB P01 to line 134b one clock cycle later. IMUXs such as shown in FIG. 5 are programmed to forward the appropriate input signals to respective LUTs or flip-flops and are not changed when the crossbar switch connectivity is changed. Likewise, LUT or flip-flop output signals are applied to the appropriate horizontal lines. The illustrated embodiment uses two adjacent CLBs in one horizontal row because each CLB includes eight LUTs and eight flip-flops, as illustrated by LUTs LUT0 through LUT7 and flip-flops FF0 through FF7 in FIG. 5 or 6, and thus each CLB can generate 16 pipelined output signals, thus two CLBs are needed to generate the 32 pipelined output signals. This embodiment requires that the LUTs can register signals, and that a sufficient number of routing lines are accessible to both the LUTs and the flip-flops. Using LUTs to register signals is described by Bauer and Young in U.S. Pat. No. 6,288,568, incorporated herein by reference.

In another embodiment, only one of the resources, LUTs or flip-flops, are used, and in order to generate 32 pipelined signals, four horizontally adjacent CLBs are needed.

In yet another embodiment, the pipelining shown in CLBs P00 and P01 is not duplicated in CLBs P10 and P11. Instead, some of the signals are pipelined in the upper row, then routed to both rows, and other signals are pipelined in the lower row, then routed to both rows. If the routing is sufficient to accommodate both routing to both rows and routing from both LUTs and flip-flops, then only one column of CLBs is required to pipeline the 32 input signals.

Vertical Pipelining

Vertically traveling signals can be pipelined without dedicating CLBs to the purpose, since the flip-flops connected to LUTs in the same CLBs with the IMUXs (see flip-flops FF0 through FF7 in FIG. 5) can register the CLB output signals. If the crossbar switch can tolerate one more stage of delay after turning a corner, then the CLBs can be programmed so that only every other CLB performs pipelining, and the pipelining latency for the vertical path is reduced by about half. Depending upon the required clock frequency for data travelling through the crossbar switch, different numbers of pipelining stages may be selected. For example, registers may be bypassed in three adjacent vertical rows, and used in a fourth row. Such an embodiment cuts by a factor of four the latency added by the vertical path. However, it is necessary to assure that a signal that has traveled the maximum un-registered horizontal length does not get too much delayed by further traveling vertically without being buffered at a pipelining stage.

In yet another embodiment, instead of using flip-flops to register the vertically moving signals, shift register LUTs do the registering. There may be advantages to one or the other embodiment due to routing lines in the selected FPGA architecture that can receive flip-flop output signals compared to routing lines that can receive LUT output signals.

Latency

Looking again at FIG. 4, an input signal applied to a pin near the bottom of the left edge, for example signal In992, and received at a pin near the left end of the bottom, for example Out7, will receive very little pipelining and will appear early at OUT7. By contrast a signal applied at In32 of FIG. 4 and received at Out1023 will experience considerable pipelining latency. In an embodiment such as illustrated in FIGS. 8–12, using 64 horizontally adjacent columns of CLBs with pipeline structures every eight CLBs, and using 64 rows of CLBs with pipeline flip-flops every four rows (actually every eight rows of CLBs because the vertically traveling signals skip rows), a signal at In992 arriving at Out7 will experience no pipeline latency and a signal at In32 arriving at Out1023 will experience maximum horizontal latency.

Shift Registers

If it is necessary that all signals experience the same amount of pipelining latency, a row of CLBs (at the bottom of the array in the FIG. 4 embodiment and at both bottom and top in the FIGS. 8–12 embodiments) can be programmed as variable length shift registers, and insert sufficient latency into quickly arriving signals such that all signals arrive at their output terminals with the same latency.

The lookup tables illustrated in detail in FIG. 3 can be programmed to be variable length shift registers, and to have their lengths changed when the connectivity of the crossbar switch is changed. The eight LUTs of a CLB are shown in FIG. 3. The shift register detail is shown and discussed by Bauer and Young in U.S. Pat. No. 6,288,568. In the structure of FIG. 3, a shift register mode can be enabled so that the CLB shifts a value in one memory cell to the next memory cell to the right at every rising clock edge. Each LUT has 16 memory cells, shown as tall thin rectangles. A value applied to the line labeled "FROM PREVIOUS CLB" to multiplexer M71 is applied to the left-most memory cell of LUT-G in slice S3. At the next clock cycle, the value in the left-most memory cell shifts rightward to the next left-most memory cell (through a path not shown), and so on, spending 16 clock cycles in LUT-G and then moving through multiplexer M72 to the left-most memory cell of LUT-F.

If necessary, multiplexers M71 and M72 of each slice S3, S2, S1 and S0 can be configured to sequentially connect all LUTs to form one shift register up to 128 bits long. The variable length is achieved by selecting where the output is taken. For example, if the seventh memory cell in LUT-G of slice S3 is connected to an output pin of the crossbar switch array, seven clock cycles of latency will have been added to that crossbar switch output signal. On the other hand, if all eight LUTs are connected into a single shift register and the rightmost memory cell of LUT-F of slice S0 is connected to the output terminal, 128 clock cycles of latency will have been added. Looking at FIG. 3, the BX and BY input pins select which slice will provide the output signal, and data input signals on lines F1 through F4 and G1 through G4 will select exactly which memory cell provides the output signal and thus how long the shift register is.

In another embodiment, the eight LUTs of FIG. 3 each serve one of the eight outputs from a crossbar switch LUT, and two vertically adjacent rows of CLBs are implemented as shift registers to provide 32 cycles of latency maximum.

Since each CLB in the crossbar switch array provides eight output signals, eight rows of CLBs will be used to provide the eight variable shift registers at the bottom edge of the array of FIG. 4. or the bottom and top edges in FIGS. 8–12. In an embodiment in which the FPGA is configured so that no more than 32 stages of pipelining will be required, then four shift registers can be implemented in a single CLB, and only two rows at top and two rows at bottom will be needed to achieve equal latency for all signals.

Note that these shift registers can be reconfigured at the same time as the multiplexers are reconfigured, since their reconfiguration data is part of the same frames. Thus reconfiguring the shift registers requires no additional time.

Latency Compensation for Input Signals

In the embodiment of FIG. 8, it is possible to compensate for vertical pipelining on the left and right sides with shift registers that do not change length when connectivity changes. This is because the vertical pipelining is associated with a particular row, and the amount of latency for vertically pipelining the signal from that row to the output terminal is known. Such compensation reduces the amount of latency that must be compensated for in the shift registers at the output terminals. Note that shift registers in two rows of a pair must provide a total latency that is equal to the number of stages of vertical pipelining. Only in the middle rows of the array will latency for the two rows of a pair be equal.

If equal latency is not necessary, these shift register structures can be omitted.

Setup and Partial Reconfiguration

Setting up an FPGA to operate as a crossbar switch can be done in two parts, a permanent part and a reconfigurable part. The permanent part forms a template that programs the general interconnect structure, the pipelining CLBs, the shift registers (if used), and the LUTs. This part is not changed or reconfigured when connectivity of the crossbar switch changes, and only that part that controls connectivity must be changed to change the connectivity. Thus connectivity can be changed with a small amount of reconfiguration.

Selecting which input pin is to be connected to which output pin and selecting shift register length are done separately from building the template. Connectivity is controlled by selecting the pattern of multiplexer control memory cells such as M0 through M12 (FIG. 7) that turn on associated transistors for the desired connectivity.

Generating the Connectivity Table

For partial reconfiguration, a connectivity table may be formed and stored in a computer that will reprogram the FPGA. This table stores an array of memory cell values that connect each input pin to each output pin.

The connectivity table will indicate the memory cell pattern for programming multiplexers Mux0 through Mux7 in each IMUX of each CLB to achieve this connection. For a given output line, all LUTs but the LUT that is to receive an input signal will be connected to receive the signal from the LUT above (in the FIG. 4 embodiment) or the LUT that immediately feeds the LUT from the output terminal in other embodiments. Thus, for each column, the connectivity table will specify which memory cell combination forms a vertical path through the column, and individual entries specify what changes are made to form a connection from an input signal.

The example of FIG. 4 implements a 1024×1024 crossbar switch using an array 32 CLBs high and 128 CLBs wide. And since each of 1024 output lines has 1024 possible connections there will be 1024 sets of memory cell values for each output line. The connectivity table will have entries for each of the 1024 output lines. Thus, for a 1024×1024 crossbar switch, the connectivity table will have slightly over 1 million entries ($2^{20}$ entries).

Looking at FIG. 4, if it is desired to connect input 95 to output Out0, all memory cells in CLBs 700, 710, and 730 to 7(31)0 that drive output Out0 will be set to pass the signal received from LUT0 or flip-flop FF0 in the CLB above to their corresponding output terminals, below. The labels PASS indicate that a signal received from a CLB above will be passed to the CLB below. However, CLB 720, which receives input 95, will be programmed to connect input 95 to its Out0 output terminal. The label TURN in FIG. 4 indicates that the signal path makes a turn in CLB 720 from horizontal to vertical. Of course, 8 output signals are generated by each CLB, and for clarity only one path is shown in FIG. 4.

The connectivity table will specify for the individual entry on connecting input 95 to output Out0, that memory cells M4 and M12 carry logic 1. (This can be understood by looking at FIG. 7 and recognizing that input 95 is equivalent to input 31 of FIG. 7, and that in multiplexer 64 input 31 is connected by turning on the transistor controlled by memory cell M4.). The table also specifies which multiplexer is being configured. By default, other memory cells carry logic 0, since in a multiplexer only one input signal is connected to the multiplexer output terminal.

The connectivity table is stored in an SRAM of a computer that accesses the FPGA

Ease of Changing Connectivity

In a Virtex-II FPGA, there are four memory cells that need to be changed to disconnect an input from an output, and four memory cells that need to be changed to make a new connection. Disconnecting requires turning off two transistors that selected a horizontal input line and turning on two transistors that select constant 1. Connecting requires turning off two transistors that supply a constant 1 and turning on two that make the desired connection to either the vertical line from above or the horizontal line from the left.

The four bits occupy at most four frames of configuration data. A frame is a column of configuration data that is loaded serially into the frame register of the FPGA configuration structure and in parallel into a frame of configuration memory. A frame is the smallest amount of configuration data that can be changed in a Virtex-II FPGA.

Thus, to disconnect one input line from one output line requires at most four frames of configuration data to be loaded into the FPGA. The same is true with making a connection. Typically, a customer will want to disconnect one input line from an output line and connect another input line to that output line. In a Virtex-II FPGA, this pair of changes requires at most six frames of data be loaded. Thus, the partial reconfiguration needed to change a connection can be accomplished in minimum time. In one Virtex-II FPGA, time to change one connection is about 140 microseconds. In other embodiments implemented in other FPGA devices, frames may be smaller, or configuration memory is addressed one word at a time, and partial reconfiguration can be accomplished in even less time.

Algorithm for Connectivity Control

Instead of using a table to control connectivity, it is possible to use an algorithm for determining changes to be made in a partial bitstream to be loaded into the FPGA. Since the CLB structure is typically identical for all CLBs of an FPGA, and since structures within the CLB are also highly regular, an algorithm can be used to calculate memory cell values, rather than storing them in a table. What's best depends on the amount of available RAM for storing a table and on maximum acceptable time to calculate and implement a partial reconfiquration.

Generating the Partial Reconfiguration Bitstream

For partial reconfiguration, a device such as the Virtex-II FPGA begins each frame with an address of a column to which the bitstream is to be sent. Thus only columns in which some data must be changed need to receive any bitstream information at all. When the connectivity is to be changed, the few columns that store the connectivity information are re-loaded into the FPGA frame register and transferred to the affected columns. An entire copy of the bitstream that is operating the FPGA is stored off-chip. When a change is to be made, this off-chip bitstream memory is updated to reflect changes in just a few memory cells, and the updated frames are transmitted to the FPGA. Only the connections actually being changed will be disrupted. Other connections, even those in affected columns, can continue transmitting data. This is because even though data will be loaded into the entire column of the changed connection, there will be no change in the remaining portions of the column as the same configuration is re-loaded, thus no disruption in their data transfer.

Clearly, the invention can be implemented,many different ways, according to the size of crossbar switch needed and the FPGA to be used. For example, although the above discussion has focused on forming the routing paths from single-length and double-length routing lines, other embodiments make use of longer length lines, and thus achieve higher speed with less required pipelining. The details depend upon the FPGA architecture that will implement the crossbar switch. It is intended that variations obvious in light of the above disclosure be included with the invention, and that the scope of the invention be determined by the appended claims.

Efficient Large Reconfigurations

If a user intends to change many connections at one time, efficiencies of scale can be achieved by making all changes implemented by the same set of frames at one time. In a frame oriented FPGA, it may require no more time to change all eight connections in a column of CLBs than it requires to change one connection. It is a time saver to take advantage of such economies.

Flexible Input/Output Arrangement

Whereas the above description assumes that input lines feed signals on one axis and output lines receive signals from another axis, there is no reason the invention needs to be limited to this arrangement. If the desired size of the crossbar switch and the available size of the FPGA allow, both input and output signals can be in the same axis. For one example, input signals can be applied at the left and output signals taken from the right. For another example, both input and output signals can be at the left. Or some can be at either side. Because FPGAs include flexible routing, and LUTs can typically drive and receive signals from all four directions, any convenient arrangement of input and output signals for which routing and pipulation are sufficient can be implemented.

System Solutions

Although the above detailed description discusses using an entire FPGA device for a crossbar switch, other embodiments can combine a crossbar switch into a system with additional elements that occupy other portions of an FPGA.

Flexible Switch Arrangement

As another aspect of the invention, although the go above description discusses in detail the use of IMUX resources to perform the multiplexer function of a crossbar switch, in other embodiments, other multiplexers available in the FPGA can be used for crossbar switch routing. Typical FPGAs, including the Virtex-II FPGA discussed above, perform interconnect routing using multiplexers controlled by configuration memory cells. Embodiments of the invention that use these other routing multiplexers controlled by configuration memory cells are also conceived as falling within the scope of the invention. Some of these embodiments are not necessarily crossbar switches (in which every input terminal is connectable to every output terminal) but are switches of other arrangements.

Although the above description discusses providing full connectivity, it is not necessary to the invention that all connections are provided. A switch that is an incomplete crossbar or another kind of switch array is also intended to be included in the scope of the invention.

Additional Embodiments

Additional embodiments made obvious by the above description are intended to be included within the scope of the present invention.

What is claimed is:

1. A method of implementing a switch in an FPGA having interconnect lines and configuration memory cells, the method comprising:

building a switch array from interconnect lines in the FPGA; and configuring the switch array by using the configuration memory cells to turn on selected programmable switches to connect lines in the switch;

wherein the step of configuring the switch array further comprises configuring multiplexers in CLBs of the FPGA.

2. The method of claim 1 wherein the multiplexers are input multiplexers (IMUXs) for routing signals on interconnect lines of the FPGA to lookup tables (LUTs) of the CLBs of the FPGA.

3. A method of implementing a switch in an FPGA having interconnect lines and configuration memory cells, the method comprising:

building a switch array from interconnect lines in the FPGA; and configuring the switch array by using the configuration memory cells to turn on selected programmable switches to connect lines in the switch;

wherein turning on selected programmable switches comprises configuring multiplexers in CLBs of the FPGA.

4. A method of implementing a switch in an FPGA having interconnect lines and configuration memory cells, the method comprising:

building a switch array from interconnect lines in the FPGA; and configuring the switch array by using the configuration memory cells to turn on selected programmable switches to connect lines in the switch;

wherein the building of the switch array from the interconnect lines in the FPGA comprises connecting routing lines of the FPGA to route input signals to CLBs of the FPGA and route output signals from the CLBs of the FPGA to output pins of the FPGA;

wherein the step of connecting routing lines of the FPGA to route input signals to CLBs of the FPGA comprises connecting horizontal lines in more than one row of CLBs to receive the same set of input signals.

5. The method of claim 4 wherein the CLBs that receive the same set of input signals comprise a plurality of groups of rows of CLBs.

6. The method of claim 5 wherein the step of connecting routing lines of the FPGA to route output signals from the CLBs of the FPGA to output pins of the FPGA comprises connecting vertical lines in one row of the plurality of groups to vertical lines in another row of the plurality of groups.

7. A method of implementing a switch in an FPGA having interconnect lines and configuration memory cells, the method comprising:

building a switch array from interconnect lines in the FPGA; and configuring the switch array by using the configuration memory cells to turn on selected programmable switches to connect lines in the switch;

wherein the step of configuring the switch array further comprises partially reconfiguring the switch array by partially reconfiguring the FPGA.

8. The method of claim 7 wherein the step of configuring the switch array comprises loading selected frames of configuration data into the FPGA to partially reconfigure the FPGA.

9. A method of implementing a switch in an FPGA having interconnect lines and configuration memory cells, the method comprising:

building a switch array from interconnect lines in the FPGA; and configuring the switch array by using the configuration memory cells to turn on selected programmable switches to connect lines in the switch;

wherein the step of building a switch array from interconnect lines in the FPGA comprises loading a template or configuration data for routing input signals from input pins to CLBs and output signals from CLBs to output pins;

wherein the output signals pass from one CLB LUT to another on their way to output pins;

wherein the output signals are temporarily stored in flip-flops within CLBs as they are being passed to output pins.

10. The method of claim 9 wherein an output signal is stored in a flip-flop within each CLB on its path to an output pin.

11. The method of claim 9 wherein an output signal is stored periodically in a flip-flop within a CLB on its path to an output pin.

12. A method of implementing a switch in an FPGA having interconnect lines and configuration memory cells, the method comprising:

building a switch array from interconnect lines in the FPGA;

configuring the switch array by using the configuration memory cells to turn on selected programmable switches to connect lines in the switch; and connecting a single input pin sequentially to a plurality of interconnect lines and sequentially providing signals between another plurality of interconnect lines and an output pin.

13. In a field programmable gate array (FPGA) having logic blocks and interconnect lines configured by memory cells, a method of configuring the FPGA to implement a crossbar switch comprising:

configuring the FPGA to implement a template crossbar switch comprising an array of input lines each connected to a plurality of configurable logic blocks (CLBs) and an array of output lines each connected between two CLBs; and configuring the FPGA to make selected connections between the input lines and the output lines.

14. The method of claim 13 wherein configuring the FPGA to make selected connections between the input lines and the output lines comprises partially reconfiguring the FPGA by loading frames of data that configure memory cells that control multiplexers in an IMUX.

15. The method of claim 13 wherein configuring the FPGA to implement a template crossbar switch comprises configuring each of the LUTs to pass one of their input signals as a LUT output signal.

16. The method of claim 15 wherein configuring the FPGA to implement a template crossbar switch further comprises configuring an IMUX to select an input line to drive the LUT.

17. The method of claim 15 wherein the CLBs are configured to apply LUT output signals to associated flip-flops to thereby register the LUT output signal.

18. The method of claim 13 wherein the selected connections between the input lines and the output lines pass through CLBs enabled to pipeline signals through the selected connections.

19. The method of claim 13 wherein configuring the FPGA to implement a template crossbar switch comprises configuring LUTs to form the AND function of their input signals, to provide one of the selected connections as one of the LUT input signals and to provide constant logic 1 values as remaining LUT input signals.

20. The method of claim 13 wherein configuring the FPGA to implement a template crossbar switch comprises:

not connecting the horizontal lines together in at least one column of CLBs, and configuring CLBs in the column to implement registers that receive a signal on a horizontal line from a column at one side of the column of CLBs and applying the signal one clock cycle later to a horizontal line in a column at another side of the column of CLBs.

21. The method of claim 13 wherein:

the step of configuring the FPGA to implement a template crossbar switch comprises configuring a plurality of CLBs at an output edge of the array to each implement a variable length shift register; and the step of reconfiguring the template crossbar switch comprises selecting a length for the shift register to achieve a latency equal to a latency of a signal routed to a different pin.

22. The method of claim 13 wherein the step of configuring the FPGA to make selected connections between the input lines and the output lines comprises dynamically reconfiguring the FPGA.

23. The method of claim 13 wherein the step of configuring the FPGA to make selected connections between the input lines and the output lines comprises partially reconfiguring the FPGA.

24. An FPGA implemented as a crossbar switch comprising:

horizontal interconnect lines connected together to form input signal paths of the crossbar switch;

CLBs having:
lookup tables (LUTs) configured to pass one of their input signals to their output terminal;

input multiplexers (IMUXs) configured to receive input signals from the horizontal interconnect lines, route selected ones of the input signals to lookup tables (LUTs) of the CLBs, the IMUXs being programmed to select between routing a signal on a horizontal line and routing a signal on a vertical line; and vertical interconnect lines each connected to an output terminal of a LUT and providing a vertical input signal to one of the IMUXs.

* * * * *